United States Patent
Krusell et al.

(10) Patent No.: US 6,594,847 B1
(45) Date of Patent: Jul. 22, 2003

(54) SINGLE WAFER RESIDUE, THIN FILM REMOVAL AND CLEAN

(75) Inventors: Wilbur Krusell, Palo Alto, CA (US); John M. de Larios, Palo Alto, CA (US); Mike Ravkin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/537,913

(22) Filed: Mar. 28, 2000

(51) Int. Cl.[7] .................... G03D 5/06; A47L 25/00; A47L 15/00; B08B 7/00; B08B 3/00
(52) U.S. Cl. .............. 15/102; 15/77; 15/88.2; 15/88.3; 15/103.5; 134/6; 134/33; 134/34; 134/902
(58) Field of Search ............... 15/77, 88.2, 88.3, 15/102, 103.5; 134/153, 902, 6, 33, 34

(56) References Cited

U.S. PATENT DOCUMENTS 5,729,856 A * 3/1998 Jang et al. .................. 15/88.1
5,861,066 A    1/1999 Moinpour et al.

FOREIGN PATENT DOCUMENTS

JP    62232923    * 10/1987   .................. 134/33
JP    63073626    * 4/1988    .................. 134/34

* cited by examiner

Primary Examiner—Robert J. Warden, Sr.
Assistant Examiner—Laura C Cole
(74) Attorney, Agent, or Firm—Martine & Penilla, LLP (57) ABSTRACT

A system is provided for use in semiconductor wafer cleaning operations. The cleaning system has a top cap and a bottom cap. The top cap seals on a top surface contact ring of a wafer, and the bottom cap seals on a bottom surface contact ring of the wafer. The wafer is held between the top cap and the bottom cap. An edge clean roller is used for cleaning an edge of the wafer. A drive roller is configured to rotate the wafer, the top cap, and the bottom cap. The edge clean roller rotates at a first velocity and the drive roller rotates at a second velocity so as to facilitate an edge cleaning of the wafer by the edge clean roller.

18 Claims, 8 Drawing Sheets

SINGLE WAFER RESIDUE, THIN FILM REMOVAL AND CLEAN

BACKGROUND OF THE INVENTION

1. Field of the Invention

The present invention relates to semiconductor wafer cleaning and, more particularly, to techniques for more efficiently cleaning wafer surfaces of interest and decreasing wafer cleaning cost.

2. Description of the Related Art

In the semiconductor chip fabrication process, it is well-known that there is a need to clean a wafer where a fabrication operation has been performed that leaves unwanted residues on the surfaces, edges, bevels, and notches of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the surface, edge, bevel, and notch of the wafer. If left on the wafer for subsequent fabrication operations, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

One wafer cleaning method commonly employed is wet cleaning. In this method, a wafer which has undergone CMP is subjected to various cleaning chemicals. The cleaning chemicals have the effect of removing the slurry residues created by the CMP process. Unfortunately, such a cleaning method has been found to be less than adequate at cleaning the wafer edge, bevels or notches. Therefore, to adequately clean these areas, an extra step of edge cleaning may be required after the wet cleaning. An example edge clean method may be one described in U.S. Pat. No. 5,861,066, entitled Method and Apparatus for Cleaning Edges of Contaminated Substrates. This U.S. Patent is incorporated herein by reference. This U.S. Patent teaches a technique that employs rollers to clean the wafer edge during a brush scrubbing operation. This brush scrubbing operation would therefore be in addition to the wet chemical cleaning. Consequently, this extra step can have the effect of wasting time and increasing the cost of wafer processing.

In some cases, the top surface and the bottom surface of the wafer require treatment with separate chemicals. In order to accomplish this along with edge cleaning, three separate cleaning operations will be required. Furthermore, in some cases, the chemicals used for the cleaning of the top surface, for example, may cause unwanted reactions with chemicals used to clean the bottom surface. As can be appreciated, this level of cleaning can become quite complex and can have the downside of substantially slowing down wafer preparation.

In view of the foregoing, there is a need for a cleaning apparatus and process that avoid the problems of the prior art by allowing the simultaneous wet cleaning and edge cleaning of the wafer. Moreover, there is a further need for a cleaning device and process which allow the cleaning of the top surface, the bottom surface, and the edge of the wafer by separate methods simultaneously.

SUMMARY OF THE INVENTION

Broadly speaking, the present invention fills these needs by providing a cleaning system which simultaneously cleans the top surface, the bottom surface, and the edge of a wafer in one cleaning system. Although the detailed description describes many embodiments in relation to wafer cleaning, the term "cleaning" should be viewed broadly to include any type of wafer preparation, such as chemical cleaning, mechanical cleaning, brush scrubbing, or any combination thereof. For instance, wafers may, during processing, be exposed to the application or removal of films on the wafers or formed thereon. These films can include deposited films, thin films, spin-coated films, and the removal of those films using techniques such as etching and CMP. It should be appreciated that the present invention can be implemented in numerous ways, including as a process, an apparatus, a system, a device or a method. Several inventive embodiments of the present invention are described below.

In one embodiment, a system for use in semiconductor wafer cleaning operations is disclosed. The cleaning system has a top cap and a bottom cap. The top cap seals on a top surface contact ring of a wafer, and the bottom cap seals on a bottom surface contact ring of the wafer. The wafer is held between the top cap and the bottom cap. An edge clean roller is used for cleaning an edge of the wafer. A drive roller is configured to rotate the wafer, the top cap, and the bottom cap. The edge clean roller rotates at a first velocity and the drive roller rotates at a second velocity so as to facilitate an edge cleaning of the wafer by the edge clean roller.

In another embodiment, a system for use in semiconductor wafer cleaning operations is disclosed. The cleaning system has a top cap and a bottom cap. The top cap seals on a top surface contact ring of a wafer, and the bottom cap seals on a bottom surface contact ring of the wafer. The wafer is held between the top cap and the bottom cap. The bottom cap, the wafer, and the top cap are held stationary by a stand. The stand holds the bottom cap, the wafer, and the top cap stationary. The cleaning system also has an edge clean roller for cleaning an edge of the wafer. The edge clean roller rotates at a first velocity, and the edge clean roller moves around the wafer at a second velocity so as to facilitate an edge cleaning of the wafer by the edge clean roller.

In yet another embodiment, a system for use in semiconductor wafer cleaning operations is provided. The cleaning system has a top cap and a bottom cap. The top cap seals on a top surface contact ring of a wafer, and the bottom cap seals on a bottom surface contact ring of the wafer. The cleaning system also has an edge clean roller for cleaning an edge of the wafer. In this system, the bottom cap and the top cap rotate the wafer. The edge clean roller rotates at a first velocity and the wafer rotates at a second velocity so as to facilitate an edge cleaning of the wafer by the edge clean roller.

The advantages of the present invention are numerous. Most notably, by designing a cleaning system which cleans three different areas of a wafer simultaneously, wafer cleaning efficiency and throughput is improved. The claimed invention removes the problems of multiple cleaning steps and multiple cleaning machines which increases wafer cleaning costs and decreases wafer cleaning efficiency.

The present cleaning system can clean the top surface, the bottom surface, and the edge of the wafer simultaneously.

Further, the present cleaning system can be contained in one housing so the wafer does not have to undergo multiple transportation steps which are frequent in traditional wet cleanings. Moreover, because multiple cleaning processes are carried out in one apparatus, the present cleaning system has good footprint utilization (takes up less floor space) which is very important for integrated systems used in the wafer fabrication. Therefore the present cleaning system will allow for more cost effective wafer cleaning and increased wafer cleaning efficiency.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention for methods and systems for simultaneously cleaning the top surface, the bottom surface, and the edge of a wafer in one cleaning system. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figure 1:
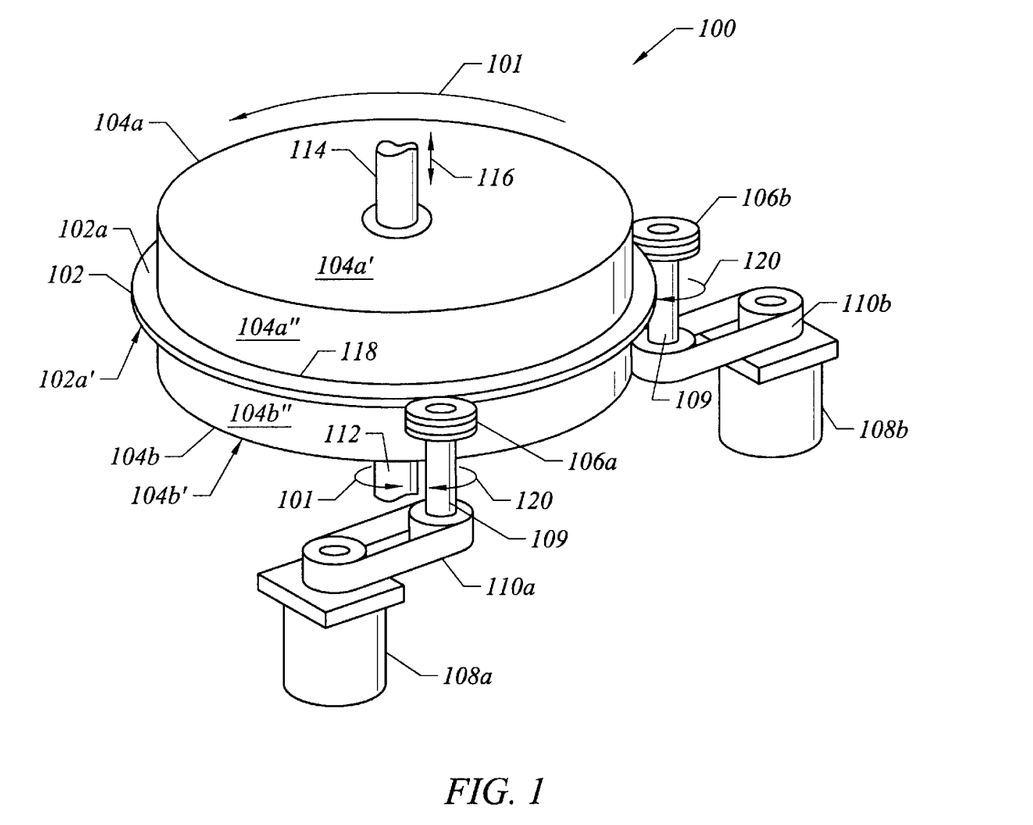
FIG. 1 shows a side view of a cleaning system, in accordance with one embodiment of the present invention.

FIG. 1 shows a side view of a cleaning system 100, in accordance with one embodiment of the present invention.

In this embodiment, the cleaning system 100 has a top cap 104a and a bottom cap 104b, both configured to hold a wafer 102 in between. The top cap 104a has a top cap surface 104a' and an upper cap wall 104a". The bottom cap 104b has a bottom cap surface 104b' and a lower cap wall 104b". A top chuck 114 is attached to the top cap surface 104a' and a bottom chuck 112 is attached to the bottom cap surface 104b'. Although the exemplary embodiment contains certain structural specifications for the top cap 104a and the bottom cap 104b, it should be appreciated that the top cap 104a and the bottom cap 104b may be of any shape that allows for containment of cleaning fluids. For instance, the top cap 104a and bottom cap 104b can be defined in a bowl shape that has walls that integrally curve up to the top cap surface 104a' and bottom cap surface 104b'.

The wafer 102 is configured such that it is between the bottom cap 104b and the top cap 104a. In one embodiment the wafer 102 is preferably placed on the bottom cap 104b and the top cap 104a is lowered onto the wafer in a movement direction 116. It should be appreciated that the caps 104 and the wafer 102 may be configured in any way which would allow for wafer surfaces to be sealed within the caps 104. A section of the wafer 102 not sealed by the caps 104 is known as an edge exclusion zone 102a.

In this embodiment, the cleaning system 100 also has a motor 108a that is connected to a belt 110a which is in turn connected to a drive stem 109. The drive stem 109 is attached to a drive roller 106a and turns at a roller rotation 120. Therefore, the motor 108a, through the belt 110a and the drive stem 109, turns the drive roller 106a. When the drive roller 106a is in contact with the wafer 102, friction is created at an edge 102a' of the wafer 102. This friction causes the wafer 102, the top cap 104a, and the bottom cap 104b to rotate in the direction a rotation 101. The rotation 101 can also be in the other direction. A second motorized mechanism is employed to clean the edge 102a' of the wafer 102. A motor 108b is connected to a belt 110b which is in turn connected to the drive stem 109. The drive stem 109 is attached to an edge clean roller 106b that turns at a roller rotation 120. When motor 108a turns the belt 110b, the drive stem 109 turns the edge clean roller 106b. The edge clean roller 106b is in frictional contact with the edge 102a' which results in edge cleaning.

Preferably, the edge clean roller 106b (which turns the wafer 102) rotates at a different rate than drive roller 106a. Thus, the wafer edge 102a' and the drive roller 106a will have about equal tangential velocities. However, the tangential velocity at the periphery of the edge clean roller 106b will be different. This defines a differential tangential velocity between each roller 106 which causes the slower rotating roller (e.g., 106b) to slip and thus create friction. It should be appreciated that the drive roller 106a will actually have the same tangential velocity as the wafer. This friction serves to clean the edge 102a'. Thus, the wafer 102 and the edge clean roller 106b can rotate at various speeds to produce the aforementioned differential tangential velocity. For a further discussion on differential tangential velocity producing systems and structures, reference can be made to U.S. Pat. No. 5,861,066, which was previously incorporated herein by reference.

In another embodiment (as will be discussed below), cleaning fluids can be preferably sprayed on the edge exclusion zone 102a thereby cleaning sections of the edge exclusion zone 102 not reachable by mechanical cleaning. The cleaning fluids can also be sprayed on or around the edge clean roller 106b during the edge clean scrubbing. Advantageously, this embodiment allows sections of the wafer 102 inside of the caps 104 to be wet cleaned with separate cleaning chemicals at the same time the edge exclusion zone 102a is cleaned chemically and mechanically.

Figure 2:
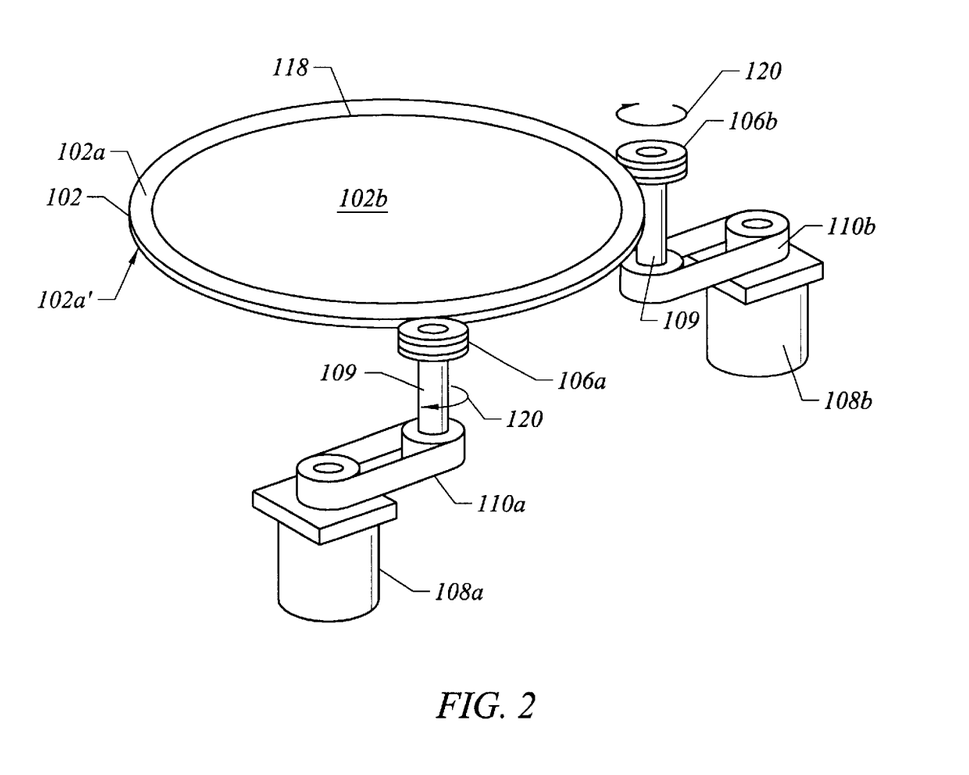
FIG. 2 illustrates a side view of the cleaning system without the top cap and the bottom cap, in accordance with one embodiment of the present invention.

FIG. 2 illustrates a side view of the cleaning system 100 without the top cap 104a and the bottom cap 104b, in accordance with one embodiment of the present invention. The motors 108 turn the belts 110 which then turn the drive stems 109. The drive stems 109 then turn the rollers 106 in the direction of the roller rotation 120. As referenced above in FIG. 1, the differential tangential velocities created by the different rotational speeds of the rollers 106 produce an edge cleaning action. In this embodiment, a contact ring 118 defines the location of sealing between the caps 104 and the wafer 102. The contact ring 118 will preferably lie outside of an active region 102b. The active region 102b is completely enclosed within the caps 104 when the caps 104 seal the wafer 102 for chemical cleaning. Once, the wafer is sealed by the caps 104, cleaning chemicals are transported into the caps 104, and cleaning of the active region 102b takes place. At the same time, as described above, the edge clean roller 106b cleans the edge of the wafer 102. Consequently, this apparatus has the benefit of cleaning the active region 102b, bottom of the wafer, and the edge 102a' of the wafer 102.

Figure 3A:
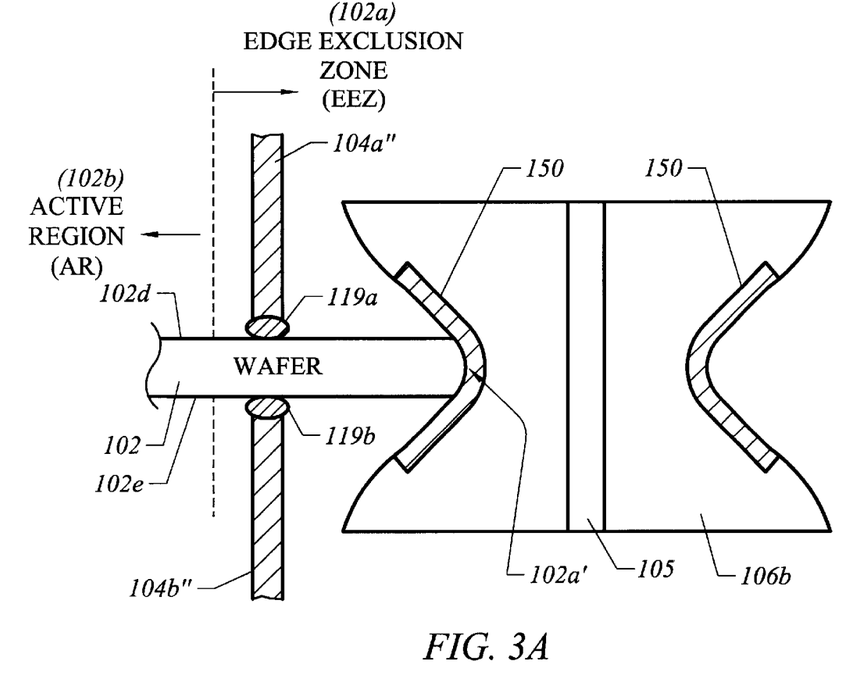
FIG. 3A depicts a close-up view of an edge clean mechanism, in accordance with one embodiment of the present invention.

FIG. 3A depicts a close-up view of an edge clean mechanism, in accordance with one embodiment of the, present invention. The edge clean roller 106b has a roller rotation axis 105 around which the edge clean roller 106b rotates. To enhance cleaning, the edge clean roller 106b contains a pad 150 made out of any material commonly used for cleaning wafers (e.g., nylon, PVA, polyurethane, etc.). In this embodiment, an upper O-ring 119a is preferably attached to the upper cap wall 104a" and a lower O-ring 119b is preferably attached to the lower cap wall 104b". The O-rings 119 create seals separating the active region 102b and the edge exclusion zone 102a. It should be understood that any device or material which can create a seal may be used to define the, active region 102b. The active region 102b is the section of the wafer inside of the upper cap wall 104a". The edge exclusion zone 102a is the area of the section of the wafer which is outside of the active region 102b. The seal created by the caps 104 allow separate cleaning chemicals to be used to clean a top surface 102d and a bottom surface 102e of the wafer 102.

Figure 3B:
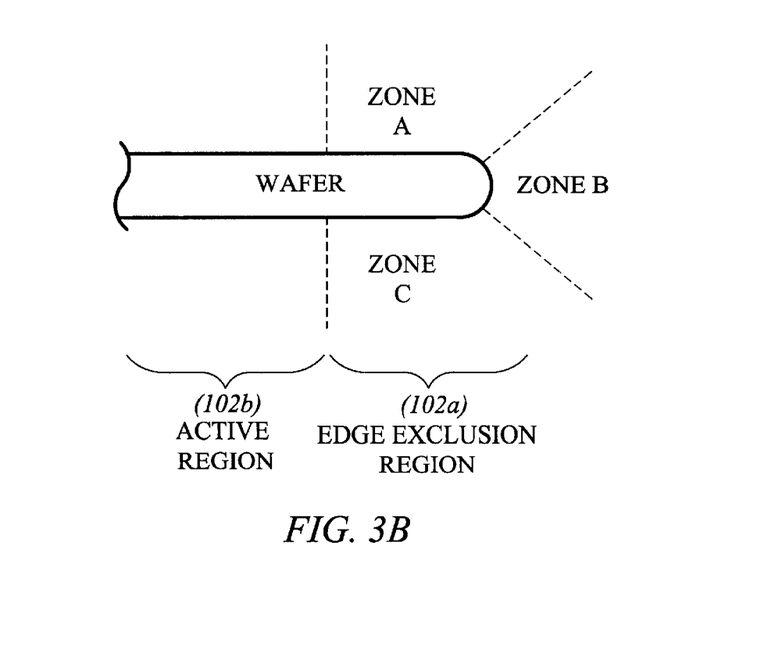
FIG. 3B shows different cleaning zones of the cleaning system, in accordance with one embodiment of the present invention.

FIG. 3B shows different cleaning zones of the cleaning system 100, in accordance with one embodiment of the present invention. Zones A and C are surfaces of the wafer 102 within the edge exclusion zone 102a and outside of the active region 102b where the edge clean roller 106b does not reach. Therefore, those zones are not cleaned mechanically but may be cleaned chemically. As described below, chemical cleaning solutions sprayed onto Zones A and C actuate cleaning of these wafer areas. Zone B is an area where the edge 102a' may be cleaned both mechanically and chemically.

Figure 4A:
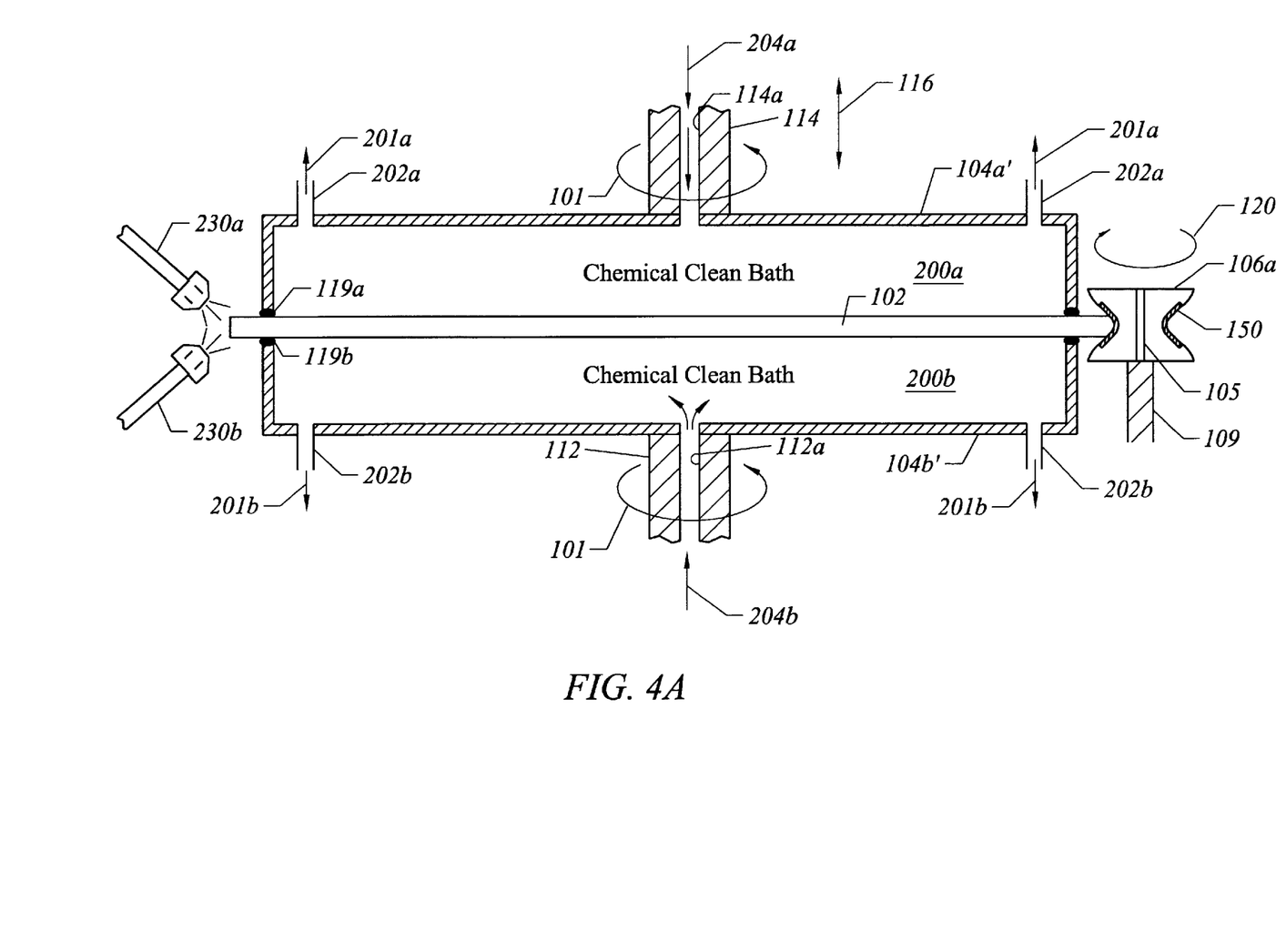
FIG. 4A depicts the cleaning system, in accordance with one embodiment of the present invention.

FIG. 4A depicts the cleaning system 100, in accordance with one embodiment of the present invention. In this embodiment, the top chuck 114 is attached to the top cap 104a at the top cap surface 104a'. A top chuck inner wall 114a defines a passage where cleaning fluid can pass into the top cap 104a. A top sprayer 230a and a bottom sprayer 230b are configured to spray cleaning fluid onto the edge 102a' of the wafer 102. The O-rings 119 are attached to the caps 104 to seal the caps 104 on the wafer 102. The edge clean roller 106b is turned by the drive stem 109 in the roller rotation 120. The pad 150 is attached to or incorporated into the edge clean roller 106b.

In this embodiment, a top cap fluid 204a enters the top cap 104a through a passage defined by the top chuck inner wall 114. In one embodiment, a volume of space defined by the top cap 104a and the wafer 102 ranges between about 100 ml and about 300 ml, and more preferably about 150 ml. It should be appreciated that the volume of space defined by the top cap 104a and the wafer 102 may be varied depending upon the type and extent of cleaning required. The top cap fluid 204a fills the top cap 104a to form a chemical clean bath 200a. The chemical clean bath 200a cleans a section of the active region 102b sealed by the top cap 104a. The cleaning chemical is then transported out of the top cap 104a through a top cap outlet 202a in the form of an output fluid 201a.

A bottom cap input fluid 204b enters the bottom cap 104b through a passage defined by the bottom chuck inner wall 112. In one embodiment, a volume of space defined by the bottom cap 104b and the wafer 102 ranges between about 100 ml and about 300 ml, and more preferably about 150 ml. As mentioned above, the volume of space defined by the bottom cap 104b and the wafer 102 may be varied depending upon the type and extent of cleaning required. The bottom cap input fluid 204b fills the bottom cap 104b to form a chemical clean bath 200b. Beneficially, the bottom cap input fluid 204b may be chemically different than the top cap input fluid 204a because the wafer 102 is sealed by the caps 104. The chemical clean bath 200b cleans the bottom of the wafer 102. While the active region 102b is being cleaned, the wafer, along with the top cap 104a and the bottom cap 104b rotates in the rotation 101. As referenced above in FIG. 1, the differential tangential velocities of the edge clean roller 106a and the edge of the wafer 102 creates friction at the point of contact between the edge clean roller 106a and the wafer 102. This friction cleans the edge 102a' of the wafer 102. The section not mechanically cleaned by edge clean roller 106a is cleaned chemically by cleaning fluid sprayed on the edge of the wafer 102 by the top sprayer 230a and the bottom sprayer 230b.

Figure 4B:
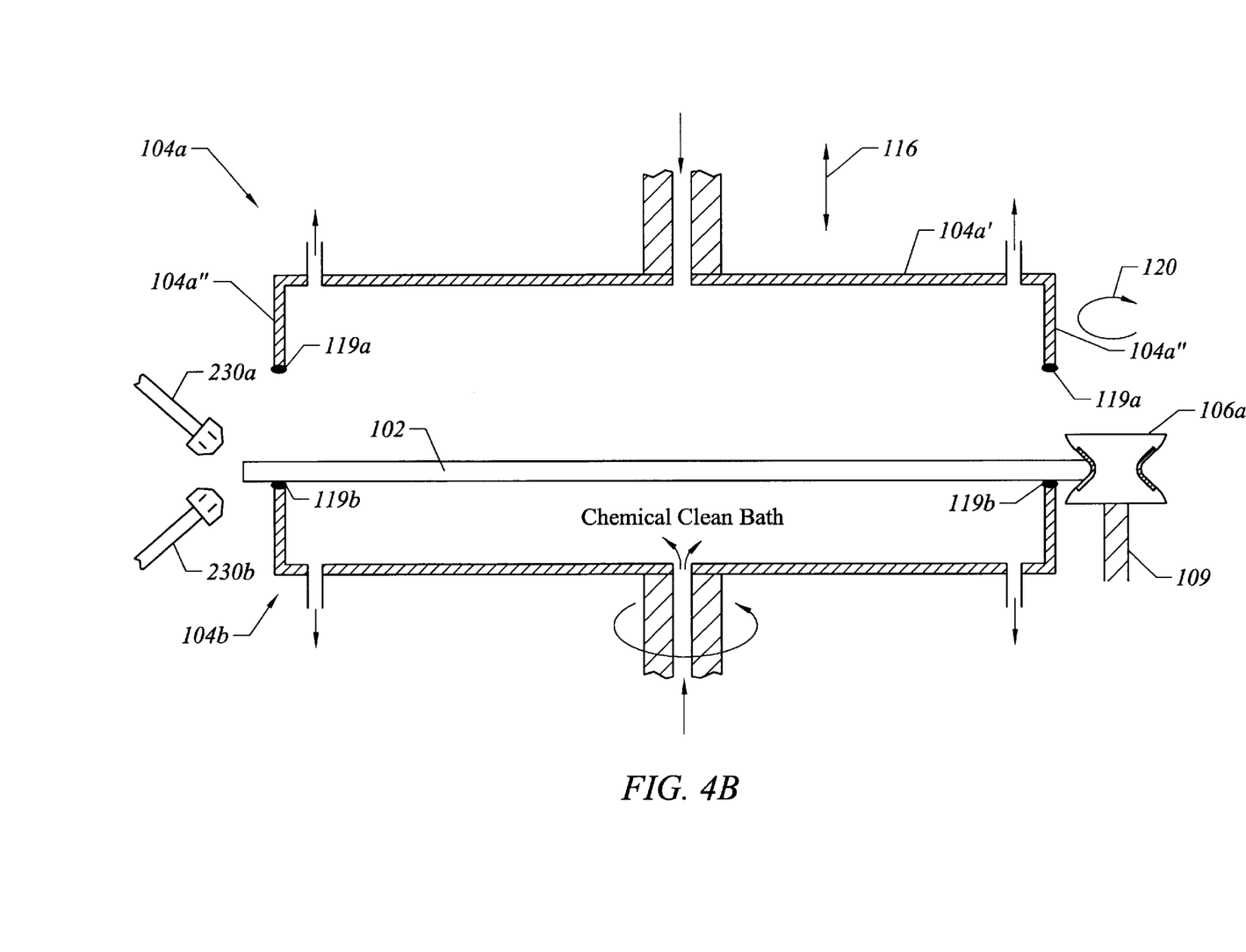
FIG. 4B portrays the cleaning system described in FIG. 4A before the top cap is lowered onto the wafer.

FIG. 4B portrays the cleaning system described in FIG. 4A before the top cap 104a is lowered onto the wafer 102. After the wafer 102 is placed onto bottom cap 104b, the top cap 104a is lowered onto the wafer by movement direction 116. The top cap is pressed against the wafer 102 to create a seal around the active region 102b. The cleaning actions referenced above in FIG. 4A then take place. This mechanism has the benefit of creating easy insertion and removal of the wafer 102 from the cleaning system 100. As will be described below, the wafer may be put into place using an end effector with edge grip capabilities.

Figure 5:
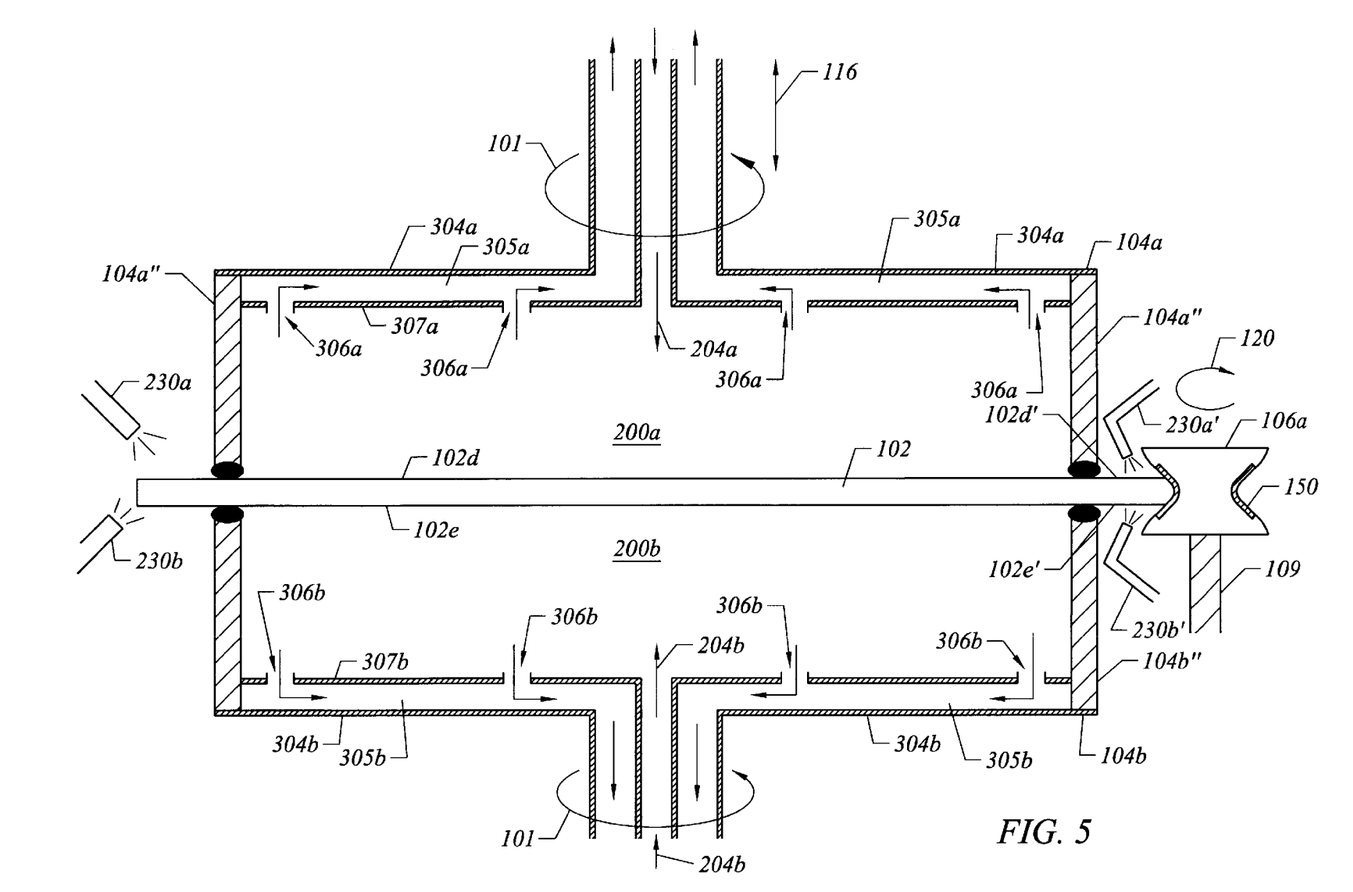
FIG. 5 shows the cleaning system with an internal fluid flow system, in accordance with one embodiment of the present invention.

FIG. 5 shows the cleaning system 100 with an internal fluid flow system, in accordance with one embodiment of the present invention. In this embodiment, the top cap 104a has an internal fluid transfer system. The top cap 104a has a top cap surface 304a and a top cap inner wall 307a. The top cap surface 304a and the top cap inner wall 307a define a top cap outlet region 305a. The top cap 104a also has the upper cap wall 104a" which encloses the top surface 102d of the active region 102b. The bottom cap 104b has a bottom cap surface 304b and a bottom cap inner wall 307b. The bottom cap surface 304b and the bottom cap inner wall 307b define a bottom cap outlet region 305b. The bottom cap 104b also has a lower cap wall 104b" which encloses the bottom surface 102e of the wafer 102. The drive stem 109 is connected to the edge clean roller 106a. A top edge clean nozzle 230a' is configured to spray cleaning fluid onto the pad 150 and a top edge 102d'. A bottom edge clean nozzle 230b' is configured to spray cleaning fluid onto the pad 150 and a bottom edge 102e'. The top spray nozzle 230a is configured to spray the top edge 102d' of the wafer 102, and the bottom spray nozzle 230b is configured to spray the bottom edge 102e' of the wafer. In one embodiment, the top spray nozzle 230a and the bottom spray nozzle 230b are preferably configured to spray cleaning chemicals on the side opposite from the edge clean roller 106b. It should be understood that the spray nozzles 230 may be configured anyplace that allows for application of the cleaning fluids on the top edge 102d' and the bottom edge 102e'.

In this embodiment, the top cap input fluid 204a is transported into the top cap 104a to form the chemical clean bath 200a. The chemical clean bath 200a cleans the top surface 102d of the wafer 102. A portion of the chemical clean bath 200a is then transported out of the top cap 104a through the top cap outlet region 305a as output fluid 306a. The bottom cap input fluid 204b is transported into the bottom cap 104b to form the chemical bath 200b. The chemical bath 200b cleans the bottom surface 102e of the wafer 102. A portion of the chemical clean bath 200b is transported out of the bottom cap 104b through the bottom cap outlet region 305b as output fluid 306b. During this cleaning process the wafer 102, the top cap 104a and the bottom cap 104b are rotated by rotation 101. At the same time, the edge clean roller is rotating by roller rotation 120. As stated above, the periphery of the edge clean roller 106b and the edge of the wafer 102 move at different tangential velocities. This differential tangential velocity creates friction which cleans the edge 102a' of the wafer 102. The top surface 102d and the bottom surface 102e of the wafer 102 may be cleaned simultaneously with separate cleaning chemicals. Further, the edge 102a' may be cleaned both mechanically and chemically while the top surface 102d and the bottom surface 102e are cleaned.

Moreover, the edge exclusion zone 102a may be cleaned by different chemicals than the top surface 102d and the bottom surface 102e. Therefore, this embodiment has the benefit of being able to accomplish the tasks of multiple apparatuses and/or cleaning operations.

In another embodiment, the bottom cap and the top cap are preferably configured to rotate without the use of the drive roller 106a. It should be appreciated that the top cap 104a and the top cap 104b may be rotated by any motorized configuration. For example, the bottom chuck 112 may be directly coupled to a motorized unit to rotate the bottom cap 104b which would rotate the wafer 102 and the top cap 104a.

Figure 6:
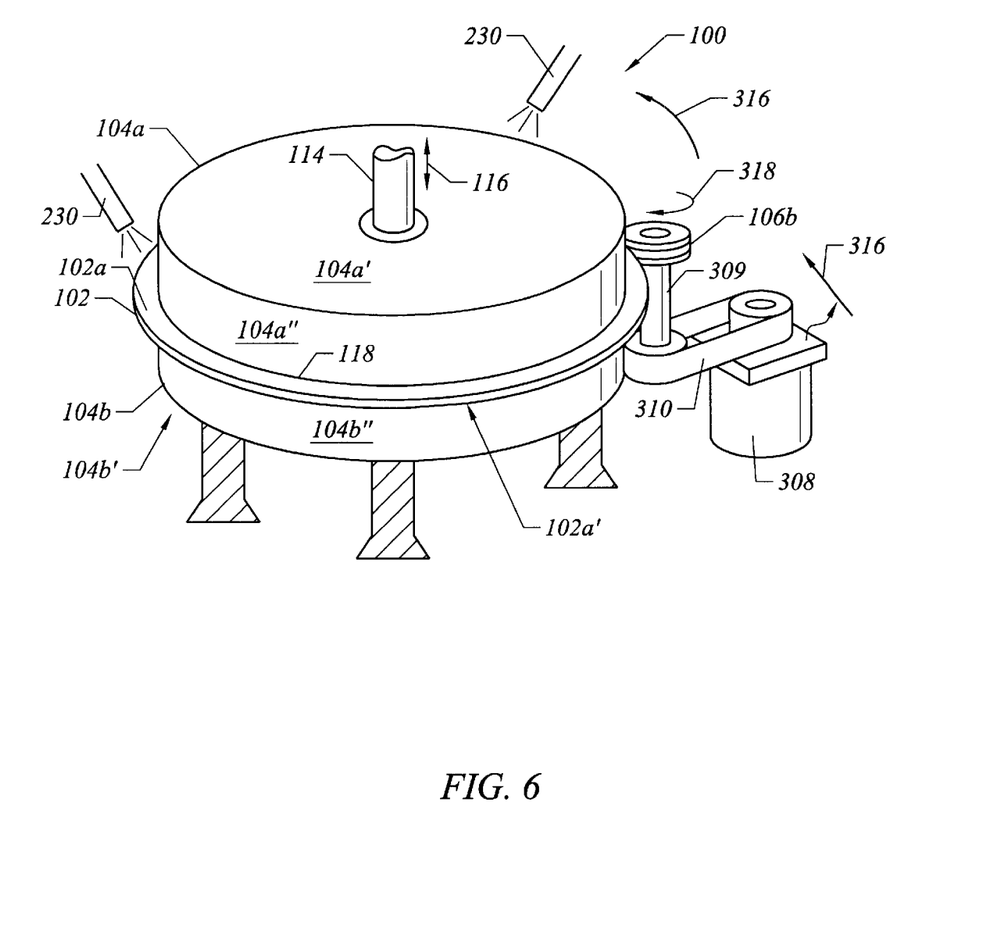
FIG. 6 shows the cleaning system, in accordance with another embodiment of the present invention.

FIG. 6 shows the cleaning system 100, in accordance with another embodiment of the present invention. In this embodiment, the bottom cap 104b is held stationary by stands 311. The stands 311 are attached to the bottom cap surface 104b'. The cap 104b also has the lower cap wall 104b". The top cap surface 104a' of the top cap 104a is attached to the top chuck 114 which raises and lowers the top cap 104a by movement direction 116. In this embodiment, the top cap 104a, the bottom cap 104b, and the wafer 102 remain stationary and do not move.

A motor 308 is attached to a belt 310 which connects to a drive stem 309. The drive stem 309 is attached to the edge clean roller 106b. The motor 308 drives the edge clean roller 106b to rotate by a roller rotation 318. At the same time the edge clean roller 106b rotates, the edge clean roller 106b itself moves around the wafer 102. Because of the roller rotation 318, the periphery of the edge clean roller 106b has a tangential velocity opposite to that of the edge 102a'. These opposing tangential velocities create friction at the contact point between the edge roller 106a and the edge 102a'. This friction serves to mechanically clean the edge 102a' of the wafer 102. This embodiment has the advantage of removing the one motorized mechanism from the cleaning system 100. At the same time, the cleaning system still cleans the top surface 102d and the bottom surface 102e by the mechanisms described in FIG. 4A.

Figure 7A:
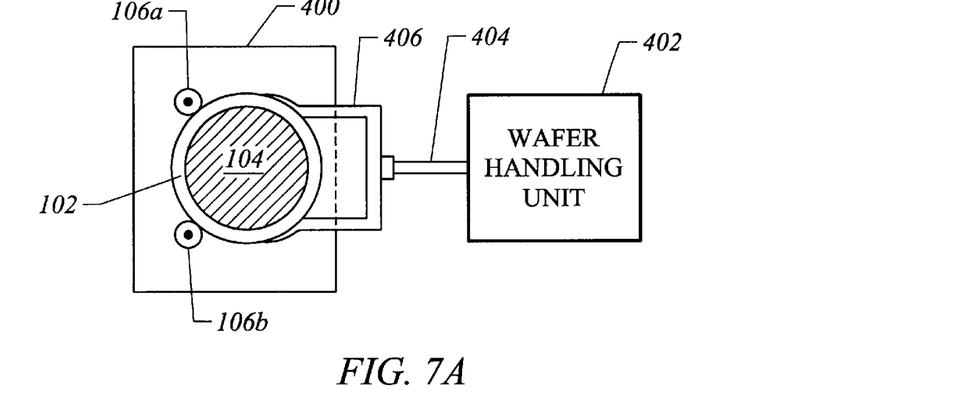
FIG. 7A illustrates a wafer being inserted or removed into or from the cleaning system, in accordance with one embodiment of the present invention.

FIG. 7A illustrates a wafer being inserted or removed into or from the cleaning system 100, in accordance with one embodiment of the present invention. In this embodiment, a wafer handling unit 402 is attached to an extension 404. An end effector 406 is connected to the end of the extension 404. The end effector 406 grips the wafer 102 which has undergone CMP or other fabrication operation and puts the wafer 102 into a cleaning system housing 400 which contains the cleaning system 100. The wafer 102 is placed in between the top cap 104a and the bottom cap 104b. The drive roller 106a and the edge clean roller 106b contact the edge 102a' of the wafer 102. The wafer 102 is thus rotated and cleaned by the apparatuses and methods referenced above in FIGS. 1–5.

Figure 7B:
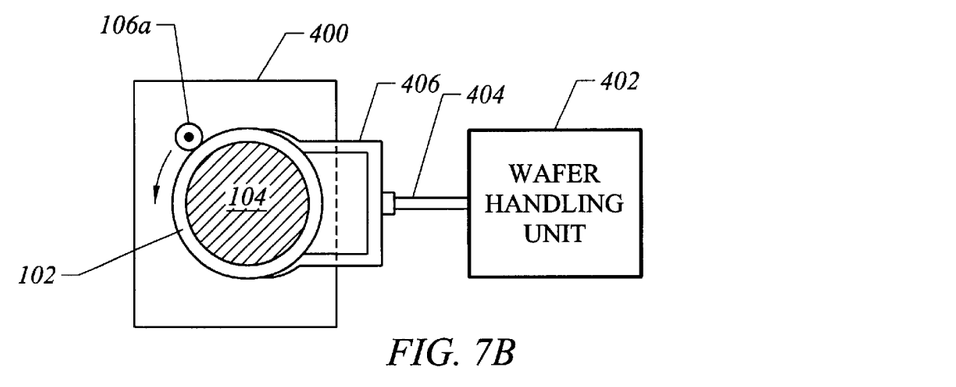
FIG. 7B depicts a wafer being inserted or removed into or from the cleaning system, in accordance with one embodiment of the present invention.

FIG. 7B depicts a wafer being inserted or removed into or out of the cleaning system 100, in accordance with one embodiment of the present invention. As referenced above in FIG. 7A, the wafer handling unit 402, the extension 404, and the end effector 406 place the wafer 102 into the cleaning system housing 400. The wafer 102 is placed on the bottom cap 104b but below the top cap 104a. But in this embodiment, the wafer 102 is stationary as are the caps 104. While the caps 104 clean the active region 102a and bottom of the wafer 102, the edge clean roller 106a rotates and moves around the wafer 102 to clean the edge 102a' through differential tangential velocity as referenced in FIG. 6.

Figure 7C:
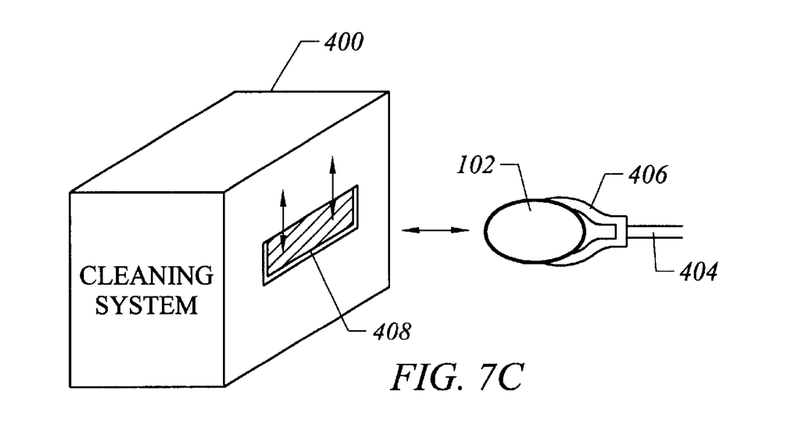
FIG. 7C shows the outside of the cleaning system, in accordance with one embodiment of the present invention.

FIG. 7C shows the outside of the cleaning system 100, in accordance with one embodiment of the present invention. In this embodiment, the extension 404 is connected to the end effector 406. The cleaning system housing 400 has a wafer input door 408 which opens to allow the wafer to be placed in the cleaning system 100. In this embodiment, the end effector 406 places the wafer 102 through the wafer input door 408 and inserts the wafer 102 within the cleaning system housing 400. During cleaning, the door is preferably closed to reduce environmental particulates. Although not shown, the cleaning system 100 can also be integrated into a larger scale system. This system may be part of a wafer CMP and clean combination and two or more cleaning systems 100 can be incorporated to the system to increase throughput.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A system for use in semiconductor wafer cleaning operations, comprising:
   a top cap;
   a bottom cap, the top cap being configured to seal on a top surface contact ring region of a wafer and the bottom cap being configured to seal on a bottom surface contact ring region of the wafer, such that the wafer is configured to be held between the top cap and the bottom cap;
   an edge clean roller for cleaning an edge of the wafer; and
   a drive roller for rotating the wafer, the top cap, and the bottom cap, the edge clean roller being configured to rotate at a first velocity and the drive roller being configured to rotate at a second velocity so as to facilitate an edge cleaning of the wafer by the edge clean roller.

2. A system for use in semiconductor wafer cleaning operations as recited in claim 1, wherein the edge clean roller has a first tangential velocity and the drive roller has a second tangential velocity, the first tangential velocity and the second tangential velocity being different to produce a differential tangential velocity that produces friction between the edge clean roller and the edge of the wafer.

3. A system for use in semiconductor wafer cleaning operations as recited in claim 1, wherein a first spray nozzle and a second spray nozzle are configured to apply a cleaning solution onto the edge of the wafer.

4. A system for use in semiconductor wafer cleaning operations as recited in claim 1, wherein the edge clean roller includes a pad to facilitate cleaning of the edge of the wafer due to the friction.

5. A system for use in semiconductor wafer cleaning operations as recited in claim 1, wherein the top cap has an upper O-ring and the bottom cap has a lower O-ring which facilitates seals respectively at the top surface contact ring region of the wafer and a bottom surface contact ring region of the wafer, the upper O-ring enclosing an active region of the wafer.

6. A system for use in semiconductor wafer cleaning operations as recited in claim 1, wherein a first volume of space is defined between the wafer and the top cap and a second volume of space is defined between the wafer and the bottom cap, the first volume of space and the second volume of space being configured to be filled with a same or different cleaning chemical fluid to treat a top wafer surface and a bottom wafer surface, respectively.

7. A system for use in semiconductor wafer cleaning operations as recited in claim 6, wherein first and second volume of space ranges between about 100 ml and about 300 ml.

8. A system for use in semiconductor wafer cleaning operations as recited in claim 1, wherein each of the top cap and bottom cap include:
   an inner wall;
   an outer wall;
   a passage defined by the inner wall and the outer wall, the passage allowing cleaning fluids to exit one of the top cap and bottom cap; and
   an inlet to enable the cleaning fluids to enter one of the top cap and bottom cap.

9. A system for use in semiconductor wafer cleaning operations as recited in claim 1, wherein the top cap is configured to be raised and lowered from over the wafer.

10. A system for use in semiconductor wafer cleaning operations, comprising:
   a top cap;
   a bottom cap, the top cap being configured to seal on a top surface contact ring region of a wafer and the bottom cap being configured to seal on a bottom surface contact ring region of the wafer, such that the wafer is configured to be held between the top cap and the bottom cap;
   an edge clean roller for cleaning an edge of the wafer;
   wherein the bottom cap and the top cap are configured to rotate with the wafer, and the edge clean roller being configured to rotate a first velocity and the wafer being configured to rotate at a second velocity so as to facilitate an edge cleaning of the wafer by the edge clean roller.

11. A system for use in semiconductor wafer cleaning operations as recited in claim 10, wherein the edge clean roller has a first tangential velocity and the wafer has a second tangential velocity, the first tangential velocity and the second tangential velocity being different to produce a differential tangential velocity that produces friction between the edge clean roller and the edge of the wafer.

12. A system for use in semiconductor wafer cleaning operations as recited in claim 10, wherein a first spray nozzle and a second spray nozzle are configured to apply a cleaning solution onto the edge of the wafer.

13. A system for use in semiconductor wafer cleaning operations as recited in claim 10, wherein the edge clean roller includes a pad to facilitate cleaning of the edge of the wafer due to the friction.

14. A system for use in semiconductor wafer cleaning operations as recited in claim 10, wherein the top cap has an upper O-ring and the bottom cap has a lower O-ring which facilitates seals respectively at the top surface contact ring region of the wafer and a bottom surface contact ring region of the wafer, the upper O-ring enclosing an active region of the wafer.

15. A system for use in semiconductor wafer cleaning operations as recited in claim 10, wherein a first volume of space is defined between the wafer and the top cap and a second volume of space is defined between the wafer and the bottom cap, the first volume of space and the second volume of space being configured to be filled with a same or different cleaning chemical fluid to treat a top wafer surface and a bottom wafer surface, respectively.

16. A system for use in semiconductor wafer cleaning operations as recited in claim 15, wherein first and second volume of space ranges between about 100 ml and about 300 ml.

17. A system for use in semiconductor wafer cleaning operations as recited in claim 10, wherein each of the top cap and bottom cap include:
   an inner wall;
   an outer wall;
   a passage defined by the inner wall and the outer wall, the passage allowing cleaning fluids to exit one of the top cap and bottom cap; and
   an inlet to enable the cleaning fluids to enter one of the top cap and bottom cap.

18. A system for use in semiconductor wafer cleaning operations as recited in claim 10, wherein the top cap is configured to be raised and lowered from over the wafer and over the wafer.

* * * * *